US012580099B2

(12) United States Patent
Hahner et al.

(10) Patent No.: US 12,580,099 B2
(45) Date of Patent: Mar. 17, 2026

(54) ELECTRICAL CABLE THAT LIMITS PARTIAL DISCHARGES

(71) Applicant: NEXANS, Courbevoie (FR)

(72) Inventors: Thomas Hahner, Verrieres le Buisson (FR); Patrick Rybski, Yerres (FR)

(73) Assignee: NEXANS, Courbevoie (FR)

( * ) Notice: Subject to any disclaimer, the term of this patent is extended or adjusted under 35 U.S.C. 154(b) by 0 days.

(21) Appl. No.: 17/749,003

(22) Filed: May 19, 2022

(65) Prior Publication Data

US 2022/0406491 A1     Dec. 22, 2022

(51) Int. Cl.
*H01B 9/02*          (2006.01)
*B64D 47/00*         (2006.01)
*H05K 9/00*          (2006.01)

(52) U.S. Cl.
CPC ............. *H01B 9/027* (2013.01); *B64D 47/00* (2013.01); *H05K 9/009* (2013.01); *H05K 9/0098* (2013.01)

(58) Field of Classification Search
CPC ...................................................... H01B 9/027
See application file for complete search history.

(56) References Cited

U.S. PATENT DOCUMENTS 3,660,592 A * 5/1972 Anderson .............. H01B 3/004
                                                    174/106 SC
3,711,631 A * 1/1973 Denes ................... H01G 4/206
                                                    174/120 SR 4,532,375 A * 7/1985 Weitzel ................ H05B 3/0004
                                                    174/106 SC
9,362,019 B2 * 6/2016 Janah ..................... H01B 3/445
2008/0283272 A1 * 11/2008 Huston .................. H01B 7/288
                                                    385/102

FOREIGN PATENT DOCUMENTS

EP          3 358 575        8/2018
WO          2012/159221      11/2012
WO      WO 2015/005857    * 1/2015

OTHER PUBLICATIONS

International Search Report dated Feb. 2, 2022.
Nexans: "Complete, reliable cables range 10, 11 for Aircraft Issue Jun. 8, 2011", Jun. 8, 2011 (Jun. 8, 2011), pp. 1-252, XP055091480.

* cited by examiner

*Primary Examiner* — Chau N Nguyen
(74) *Attorney, Agent, or Firm* — IPSILON USA, LLP

(57)                ABSTRACT

An aerospace cable that limits the occurrence of partial discharges includes an elongate electrically conductive element surrounded by a semiconductor layer and an insulation system around the semiconductor layer. This insulation system has an electrically insulating layer surrounding the semiconductor layer. Each layer of the insulation system has a radial thickness ($e_i$ . . . ), and in that an equivalent insulation thickness ($t_{eq}$) of this insulation system is greater than or equal to the result of a third-degree polynomial function equation of a minimum pressure and of a maximum temperature at which the cable is intended to be used.

11 Claims, 1 Drawing Sheet

ELECTRICAL CABLE THAT LIMITS PARTIAL DISCHARGES

RELATED APPLICATION

The present application claims the benefit of priority from French Patent Application No. 21 05353, filed on May 21, 2021, the entirety of which is incorporated by reference.

FIELD OF THE INVENTION

The present invention relates to an insulated electrically conductive element, or cable, that limits the occurrence of partial discharges, and to an electrically conductive cable comprising such an element.

DESCRIPTION OF RELATED ART

Electrical cables generally comprise at least one electrically conductive element surrounded by at least one layer of an insulating material and potentially one or more layers of a semiconductor material.

While the cable is in operation, partial discharges may occur. These partial discharges may appear on the surface of the insulation and/or in the insulation when air bubbles or cavities are present in the one or more layers surrounding the electrically conductive element or between a layer and the element (conductor or layer) that it surrounds.

In the aerospace field, cables are subjected to high voltages which, in combination with conditions such as moisture, high temperatures and low pressures, may promote the occurrence of partial discharges. Partial discharges, which are minute electrical arcs in the insulating material, cause, over time, the electrically insulating material to degrade, in particular through slow erosion, which may lead to dielectric breakdown thereof. One solution to prevent the occurrence of partial discharges is often to increase the thickness of the insulating layer.

The problem of partial discharges in electrical cables has become more significant with the development of hybrid or electric propulsion systems, in particular in the aerospace field. Specifically, in such systems, the cables will have to convey voltages and currents of increasingly high intensities in order to reach powers that may range up to several tens of megavoltamperes (MVA).

Additionally, at high voltage, partial discharges on the surface of the cable are observed, and corona discharges are more particularly observed at low pressure and high temperature. In an aircraft in flight, the exterior pressure to which a cable is exposed, which is not in the regulated pressurized area of the aircraft, may drop, for example, down to 145 hPa (145 mbar), or even down to 90 hPa (90 mbar).

At such high voltage values, it is known practice in solutions for terrestrial power distribution to use three-layer cables in which the insulating layer is placed between two semiconductor layers. However, this solution requires the exterior semiconductor layer to be removed to make connections and the connection system to incorporate a system with electric field control, which makes the use of this system in the aerospace field difficult. Three-layer cables also exhibit substantial thickness in order to prevent the occurrence of partial discharges.

However, in the aerospace field, constraints may be variable. Since not all aircraft fly at very high altitude (13.7 km or 45 k ft), there is a need for cables designed for aerospace uses that have intermediate operating constraints, in particular flight altitudes lower than 10.6 km (35 k ft), and exposed to voltages lower than 1000 V. In addition, there is a need to facilitate the use of such aerospace cables, which do not need special end preparation to connect them.

OBJECTS AND SUMMARY

There is therefore a need for a cable that is ready to use and able to be connected without modifying its end, and that withstands voltage spikes, or partial discharge inception voltage (PDIV), the values of which are dictated by the aircraft manufacturer. In general, an amplitude threshold (Vpeak) is established for these partial discharge inception voltages, which takes into account transient, ripple and reflection effects, as well as a safety margin.

The object of the present invention is to address at least one of the drawbacks of the prior art in terms of weight, bulk and ease of use by providing an electrical cable that features an insulation system allowing it to be subjected to high voltages and large currents while limiting or even preventing the occurrence of partial discharges, such that the insulation system is of reduced thickness.

A first subject of the present invention is an aerospace cable that limits the occurrence of partial discharges, comprising an elongate electrically conductive element and a semiconductor layer surrounding the elongate electrically conductive element, and an insulation system comprising one or more electrically insulating layers surrounding said semiconductor layer, such that each layer of the insulation system has a radial thickness, and in that an equivalent insulation thickness of this insulation system is greater than or equal to the result of a polynomial function equation of a minimum pressure and of a maximum temperature at which the cable is intended to be used. Preferably, this polynomial equation may be a third-degree polynomial equation and is a function of a partial discharge inception voltage (PDIV) in the cable under said minimum pressure and maximum temperature conditions.

Advantageously, the thickness of the insulation layer is reduced with respect to cables of the prior art seeking to prevent the occurrence of partial discharges, which allows the electrically conductive element to be lightweight and to be suitable for use in fields that require lightweight electrical cables like, for example, the aerospace field.

According to one preferred embodiment, determining the thickness of the one or more insulation layers may involve a calculation, for example a calculation implemented by computer. In particular, the applicants discovered that Paschen's law allowed the behavior of the insulation of a cable whose structure is a set of concentric thicknesses to be modeled by determining the threshold of the breakdown voltage in air between two electrodes, one of which is covered with insulation corresponding to that of the cable in thickness, and such that a given voltage, which may correspond to the partial discharge inception voltage threshold in the cable, is applied to the electrodes.

Thus, the partial discharge inception voltage (PDIV) under the minimum pressure and maximum temperature conditions taken into account in the invention may be defined at a value higher than a breakdown voltage in air between two electrodes, one of which is covered with an insulation system whose materials and thickness are identical, respectively, to those of the insulation system of the cable.

More particularly, the equivalent insulation thickness $t_{eq}$ may be such that:

$$t_{eq} \geq \sum_{n=1}^{4} a_n \cdot PDIV^{n-1} \qquad \text{[Math. 1]}$$

with $$a_n = \sum_{m=1}^{4} b_{n,m} \cdot p_T^{n-1} \qquad \text{[Math. 2]}$$

and $$p_T = \frac{273,15}{273,15 + T} \qquad \text{[Math. 3]}$$

where $p_T$ is the minimum pressure, in particular a minimum pressure between 90 and 1100 hPa T is the maximum temperature, in particular a temperature between −65 and 260° C.

and PDIV represents the partial discharge inception voltage under the minimum pressure and maximum temperature conditions, in particular with an amplitude of between 0.8 and 5 kV ($kV_{peak}$).

Another subject of the invention is a multilayer insulation system such that the equivalent insulation thickness $t_{eq}$ is determined as a function of the respective radial thicknesses of each of the layers forming the insulation system and such that:

$$t_{eq} = \sum_{x=1}^{\text{Nombre de couches de l'isolation}} \frac{e_x}{\varepsilon_{rx}} \qquad \text{[Math. 4]}$$

where $e_x$ is the thickness of a layer x and $\varepsilon_{rx}$ is the permittivity of the layer x.

In particular, these cables are intended to be used under maximum temperature conditions which may be lower than or equal to 260° C., and/or minimum pressure conditions of at least 90 hPa and at most 1100 hPa.

Preferably, one target use of the cable according to the invention is a use in which the insulation system may fully or partly define the outer periphery of the cable exposed to an exterior atmosphere which may correspond to the minimum pressure and/or to the maximum temperature. In particular, the cable may still be covered with a braid, leaving the insulation system partly accessible to the exterior atmosphere. The function of this braid may be electromagnetic shielding or electrical conduction.

Alternatively, another subject of the invention may be an insulation system surrounded by a braid, which is itself covered with a sheath.

More particularly, a cable according to the invention may be without a semiconductor layer radially exterior to the insulation system. In other words, the cable may comprise a single semiconductor layer, which is arranged between the conductor and the insulation system.

Lastly, to improve visual checking and monitoring of the state and safety of the cable, the insulation system may comprise a layer comprising colored pigments. Thus, when such a cable is not uniform in color, it allows worn areas to be located.

Another subject of the invention is a use of a cable according to the invention in an aircraft whose maximum flight altitudes are such that the minimum pressure at which the cable is used is a function of this maximum flight altitude.

Electrically Insulating Layer

Preferably, the semiconductor layer has a thickness $e_1$, the value of the thickness $e_i$ of the electrically insulating layer satisfying the following relationship:

$$ei \geq e1 \qquad \text{[Math. 5]}$$

In the present invention, the sum of the thicknesses ei of the insulation system is, in particular, a mean radial thickness which may vary by ±30%, preferably by ±20%, and particularly preferably by ±10% with respect to this mean radial thickness. This variation in thickness may be random and be due in particular to the method of application of said layer on the element or the layer surrounding it.

The electrically insulating layer may comprise at least one silicone, and/or a fluorosilicone, and/or an olefin polymer, chosen from a linear low-density polyethylene (LLDPE); a very low-density polyethylene (VLDPE); a low-density polyethylene (LDPE); a medium-density polyethylene (MDPE); a high-density polyethylene (HDPE); an ethylene propylene monomer (EPM) copolymer; an ethylene propylene diene monomer (EPDM) terpolymer; a copolymer of ethylene and of vinyl ester such as an ethylene-vinyl acetate (EVA) copolymer; a copolymer of ethylene and of acrylate, such as an ethylene butyl acrylate (EBA) copolymer or an ethylene methyl acrylate (EMA) copolymer; a copolymer of ethylene and of α-olefin such as a copolymer of ethylene and of octene (PEO) or a copolymer of ethylene and of butene (PEB); a fluoropolymer, in particular chosen from copolymers obtained on the basis of tetrafluoroethylene monomer, and in particular from polytetrafluoroethylene (PTFE), fluorinated ethylene propylene (FEP) copolymers such as, for example, poly(tetrafluoroethylene-co-hexafluoropropylene), perfluoroalkoxy alkane (PFA) copolymers such as, for example, perfluoro(alkyl vinyl ether)/tetrafluoroethylene copolymers, perfluoromethoxy alkane (MFA) copolymers; and ethylene tetrafluoroethylene (ETFE); and one of the mixtures thereof.

Preferably, the electrically insulating layer may comprise at least one fluoropolymer, in particular chosen from copolymers obtained on the basis of tetrafluoroethylene monomer, and in particular from polytetrafluoroethylene (PTFE); fluorinated ethylene propylene (FEP) copolymers such as, for example, poly(tetrafluoroethylene-co-hexafluoropropylene); perfluoroalkoxy alkane (PFA) copolymers such as, for example, perfluoro(alkyl vinyl ether)/tetrafluoroethylene copolymers; perfluoromethoxy alkane (MFA) copolymers; and ethylene tetrafluoroethylene (ETFE); or one of the mixtures thereof.

Particularly preferably, the electrically insulating layer may comprise one or more perfluoroalkoxy alkane (PFA) copolymers.

Preferably, the electrically insulating layer may comprise the same polymeric composition as the semiconductor layer.

In the present invention, a polymeric composition corresponds to a composition comprising one or more polymers in a given amount, and in particular with percentages by weight of given polymers. The polymeric composition essentially comprises one or more polymers, preferably only one or more polymers.

Preferably, the electrically insulating layer may comprise the same polymeric composition as the semiconductor layer, the polymeric composition comprising one or more perfluoroalkoxy alkane (PFA) copolymers.

The electrically insulating layer may comprise at least 50% by weight of polymer(s), preferably at least 70% by weight of polymer(s), even more preferably at least 80% by weight of polymer(s), and even more preferably at least 90% by weight of polymer(s).

The electrically insulating layer of the invention may conventionally comprise additional agents such as, for example, fillers, pigments, crosslinking agents, flame-retardant fillers, etc.

The electrically insulating layer may be a layer that is extruded around the electrically conductive element.

Preferably, the semiconductor layer is extruded around the electrically conductive element. Particularly preferably, the electrically insulating layer is co-extruded with the semiconductor layer, together around the electrically conductive element.

In the present invention, what is meant by "electrically insulating layer" is a layer whose electrical conductivity is very low or even zero, in particular lower than $10^{-6}$ S/m, and preferably lower than $10^{-13}$ S/m, within the operating temperature range of up to 260° C.

Preferably, the electrically insulating layer for the electrically conductive element of the invention may have a dielectric permittivity according to the ASTM D150 standard of lower than 2.3, preferably lower than 2.2, and particularly preferably lower than 2.1; for a frequency of between 100 Hz and 100 kHz and at a temperature from 0 to 200° C.

According to one preferred embodiment, the electrically conductive element may be used in the aerospace field.

Electrically Conductive Element

The elongate electrically conductive element may be a single-part conductor, such as, for example, a metal wire, or a multipart conductor, such as a plurality of metal wires which are or are not twisted, preferably a plurality of metal wires which are or are not twisted, so as to increase the flexibility of the cable. When it comprises a plurality of metal wires, these may be Litz wires, such that the Litz wires are enameled, and these are particularly effective for wide sections of electrically conductive element in order to improve the reduction of skin effects, and therefore Joule heating and overheating of the cable. When the cable comprises a plurality of metal wires, some of the metal wires at the center of the conductor may be replaced with non-metal wires.

The elongate electrically conductive element may be made of aluminum, of aluminum alloy, of copper, of copper alloy, and one of the mixtures thereof.

The elongate electrically conductive element may comprise one or more carbon nanotubes or with graphene in order to increase electrical conductivity, thermal conductivity and/or mechanical strength.

According to one possible embodiment, the electrically conductive element may be covered with a metal or with an alloy different from the metal forming the conductor or different from the alloy forming the conductor, such as, for example, nickel, a nickel alloy, tin, a tin alloy, silver, a silver alloy or one of the mixtures thereof. Such a covering, called plating, may allow the conductor to be protected from corrosion and/or its contact resistance to be improved.

The electrically conductive element being formed of a metal or of a metal alloy means that the electrically conductive element comprises at least 70%, preferably at least 80%, and even more preferably at least 90% of said metal or of said alloy.

The electrically conductive element may have a cross section ranging from 3 mm² (AWG 12) to 107 mm² (AWG 0000), preferably ranging from 14 mm² (AWG 6) to 107 mm² (AWG 0000), preferably ranging from 34 mm² (AWG 2) to 107 mm² (AWG 0000), and even more preferably ranging from 68 mm² (AWG00) to 107 mm² (AWG0000).

The electrically conductive element may have an outer diameter ranging from 2.0 mm to 20 mm, preferably ranging from 4.5 mm to 18 mm, preferably ranging from 7.0 mm to 16 mm, and even more preferably ranging from 10 mm to 15.2 mm.

Semiconductor Layer

The semiconductor layer may comprise at least one silicone, and/or a fluorosilicone, and/or an olefin polymer, chosen from a linear low-density polyethylene (LLDPE); a very low-density polyethylene (VLDPE); a low-density polyethylene (LDPE); a medium-density polyethylene (MDPE); a high-density polyethylene (HDPE); an ethylene propylene monomer (EPM) copolymer; an ethylene propylene diene monomer (EPDM) terpolymer; a copolymer of ethylene and of vinyl ester such as an ethylene-vinyl acetate (EVA) copolymer; a copolymer of ethylene and of acrylate, such as an ethylene butyl acrylate (EBA) copolymer or an ethylene methyl acrylate (EMA) copolymer; a copolymer of ethylene and of α-olefin such as a copolymer of ethylene and of octene (PEO) or a copolymer of ethylene and of butene (PEB); a fluoropolymer, in particular chosen from copolymers obtained on the basis of tetrafluoroethylene monomer, and in particular from polytetrafluoroethylene (PTFE), fluorinated ethylene propylene (FEP) copolymers such as, for example, poly(tetrafluoroethylene-co-hexafluoropropylene), perfluoroalkoxy alkane (PFA) copolymers such as, for example, perfluoro(alkyl vinyl ether)/tetrafluoroethylene copolymers, perfluoromethoxy alkane (MFA) copolymers; and ethylene tetrafluoroethylene (ETFE); and one of the mixtures thereof.

Preferably, the semiconductor layer may comprise at least one fluoropolymer, in particular chosen from polytetrafluoroethylene (PTFE); fluorinated ethylene propylene (FEP) copolymers such as, for example, poly(tetrafluoroethylene-co-hexafluoropropylene); perfluoroalkoxy alkane (PFA) copolymers such as, for example, perfluoro(alkyl vinyl ether)/tetrafluoroethylene copolymers; perfluoromethoxy alkane (MFA) copolymers; and ethylene tetrafluoroethylene (ETFE); or one of the mixtures thereof.

Particularly preferably, the semiconductor layer may comprise one or more perfluoroalkoxy alkane (PFA) copolymers.

The semiconductor layer may comprise at least 50% by weight of polymer(s), preferably at least 70% by weight of polymer(s), even more preferably at least 80% by weight of polymer(s), and even more preferably at least 90% by weight of polymer(s).

The semiconductor layer of the invention may conventionally comprise electrically conductive fillers. By way of example, it may comprise from 0.1% to 40% by weight of electrically conductive fillers, such as, for example, carbon black, carbon nanotubes, etc. The semiconductor layer allows the electric field around the electrically conductive element to be attenuated.

The semiconductor layer may be a layer extruded around the elongate electrically conductive element, or a layer in the form of a ribbon wound around the elongate electrically conductive element, or a layer of varnish deposited around the elongate electrically conductive element, or one of the combinations thereof.

Preferably, the electrically insulating layer is extruded around the semiconductor layer.

The semiconductor layer may have a thickness $e_1$ ranging from 0.05 mm (millimeters) to 1.0 mm, preferably ranging from 0.07 mm to 0.8 mm, and particularly preferably a thickness ranging from 0.09 mm to 0.5 mm.

In the present invention, what is meant by "semiconductor layer" is a layer whose volume resistivity is lower than 10 000 Ωxm (ohm-meters) (at ambient temperature), preferably lower than 1000 Ωxm, and particularly preferably lower than 500 Ωxm.

According to one preferred embodiment, the semiconductor layer may be directly placed around the electrically conductive element and therefore be in direct physical contact with said element. The semiconductor layer thus allows the electric field to be smoothed around the conductor.

The semiconductor layer may have an outer diameter ranging from 0.3 mm to 22 mm, preferably ranging from 0.8 mm to 18 mm, preferably ranging from 1.0 mm to 16 mm, and particularly preferably ranging from 1.2 mm to 12 mm.

Cable Forming a Single Insulated Electrically Conductive Element

The cable according to the invention may be used at an intensity that may range from 35 $A_{RMS}$ to 1000 $A_{RMS}$, preferably from 80 $A_{RMS}$ to 600 $A_{RMS}$, particularly preferably from 190 $A_{RMS}$ to 500 $A_{RMS}$, these values being given for a maximum temperature of the conductor in service of 260° C.

The cable according to the invention may be used with DC or with AC. When it is used with AC, the operating frequency may range from 10 Hz (hertz) to 100 kHz (kilohertz), preferably from 10 Hz to 10 kHz, particularly preferably from 10 Hz to 3 kHz. In a PWM system, what is meant by frequency is the fundamental frequency of the current.

The cable according to the invention may be used in an aircraft in a pressurized or unpressurized area, with a power ranging from 8 kVA (kilovoltamperes) to 3000 kVA, preferably from 100 kVA to 2000 kVA, and particularly preferably from 250 kVA to 1500 kVA.

Electrically Conductive Cable

A second subject of the invention relates to an electrically conductive cable comprising one or more insulated electrically conductive elements as described above.

The voltage, intensity, power and frequency values described for the cable forming a single insulated electrically conductive element also apply for the electrically conductive cable.

The electrical cable may comprise a metal shield forming electromagnetic shielding. In the case where the cable comprises a single insulated electrically conductive element, the metal shield may be placed around the electrically insulating element. In the case where the cable comprises a plurality of insulated electrically conductive elements, the metal shield may also be placed around all of the insulated electrically conductive elements.

Additionally, the electrically conductive cable may comprise a protective sheath.

The protective sheath may be a layer based on polymers such as those described for the electrically insulating layer. For an application in the aerospace field, the protective sheath may preferably be based on one or more fluoropolymers (such as, for example, PTFE, FEP, PFA and/or ETFE) and/or on polyimide.

Preferably, the protective sheath may be the outermost layer of the cable.

The protective sheath may be in the form of a ribbon, of an extrudate or of a varnish.

DESCRIPTION OF ONE OR MORE EMBODIMENTS

For reasons of clarity, only those elements that are essential to the understanding of the embodiments described below have been presented diagrammatically, without regard to scale.

Figure 1:
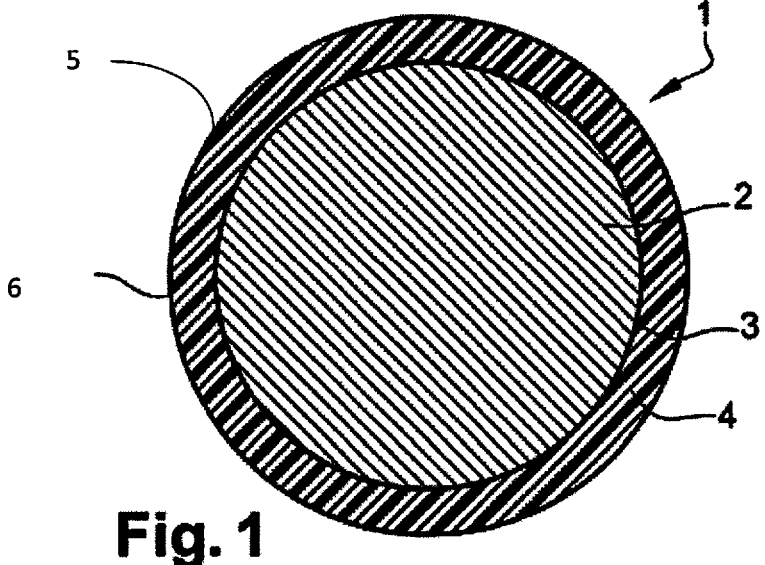
FIG. 1 shows a cross-sectional view of a cable according to the invention.
Figure 2:
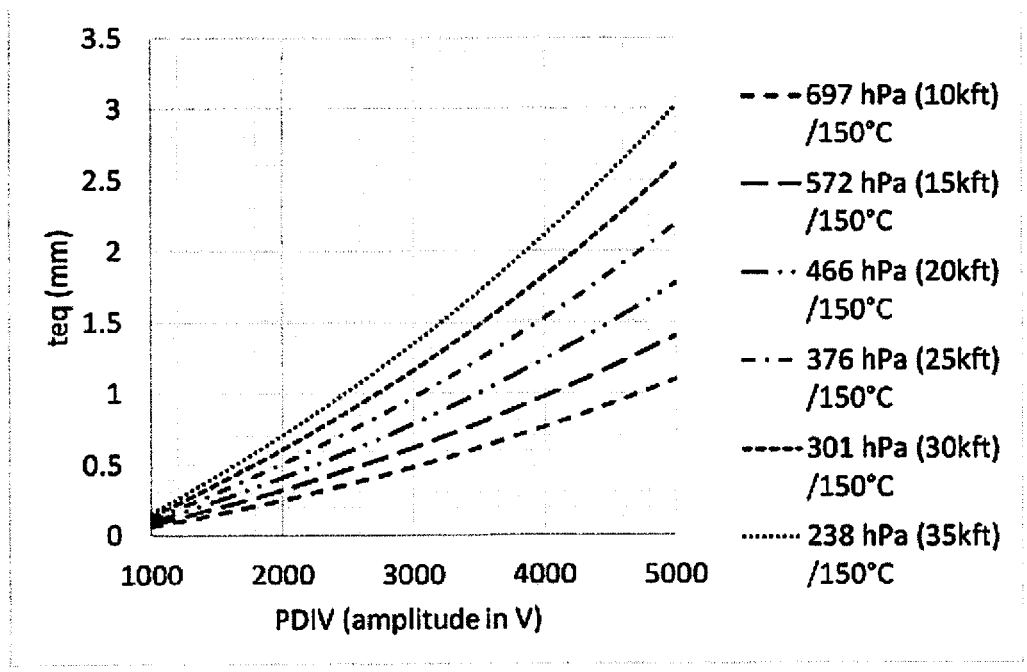
FIG. 2 shows a graph of the changes in an equivalent insulation thickness (teq) of a cable according to the invention as a function of various minimum pressures and for a maximum temperature of 150° C. at which the cable is intended to be used.

As illustrated in FIG. 1, a cable forming a single insulated electrically conductive element 1 according to one embodiment of the invention comprises an elongate electrically conductive element 2, a semiconductor layer 3 surrounding the elongate electrically conductive element 2, and an electrically insulating layer 4 surrounding the semiconductor layer 3. FIG. 1 also illustrates the optional a braid 5, covered by a sheath 6.

The elongate electrically conductive element 2 is formed by 37 strands made of copper covered with a layer of nickel and thus has a diameter of 12 AWG (American Wire Gauge).

The material of the semiconductor layer 3 and of the insulating layer 4 comprises PFA. The semiconductor layer is formed from a polymeric mixture A comprising at least 60% by weight of perfluoroalkoxy alkane (PFA) copolymer in relation to the total weight of the polymeric mixture. The polymeric mixture A is, for example, sold under the reference S185.1 B by PolyOne.

The electrically insulating layer is formed from a second polymeric mixture B comprising at least 95% by weight of perfluoroalkoxy alkane (PFA) copolymer in relation to the total weight of the polymeric mixture. The polymeric mixture B is, for example, sold under the reference AP-210 by DAIKIN. The permittivity of this material obtained by polymerizing the polymeric mixture B is 2.1.

The polymeric mixtures A and B were each introduced into one of the two extruders for the two-layer co-extrusion and extruded around the elongate electrically conductive element 2.

The cable according to the invention for withstanding a "pressure at flight temperature" PT is determined such that $$p_T = \frac{273{,}15}{273{,}15 + T} \qquad \text{[Math. 2]}$$

where $p_T$ is the minimum pressure

T is the maximum temperature. And such that the coefficients $b_{n,m}$ are the following

| $b_{n,m}$ | n = 1 | n = 2 | n = 3 | n = 4 |
|---|---|---|---|---|
| m = 1 | −0.58133 | 0.81629 | 0.02282 | 0.00864 |
| m = 2 | 2.11632 | −2.91153 | −0.02497 | −0.03217 |
| m = 3 | −2.88833 | 3.94018 | 0.01584 | 0.04238 |
| m = 4 | 1.31095 | −1.78528 | −0.01122 | −0.01814 | and allow the coefficients of the third-degree polynomial equation to be calculated for a given minimum pressure and a given maximum temperature, where $$a_n = \sum_{m=1}^{4} b_{n,m} \cdot p_T^{n-1} \qquad \text{[Math. 2]}$$

And when a user sets a PDIV resistance threshold expressed in amplitude (kVpeak) representing the amplitude of the partial discharge inception voltage (PDIV) under these minimum pressure and maximum temperature conditions at a given value, it is then possible, by virtue of the invention, to determine the equivalent insulation thickness $t_{eq}$ required for this cable by applying the equation below.

$$t_{eq} \geq \sum_{n=1}^{4} a_n \cdot PDIV^{n-1} \qquad \text{[Math. 1]}$$

It is thus determined for a minimum pressure of 1000 mbar and a given maximum temperature of 80° C., and a PDIV resistance threshold with an amplitude of 3.946 kV (Vpeak), the equivalent insulation thickness (teq) of this insulation system must be 0.4762 mm.

| | |
|---|---|
| a1 | −0.06576 |
| a2 | 0.09544 |
| a3 | 0.00779 |
| a4 | 0.00072 |

This equivalent insulation thickness teq for this insulation system is then translated into a radial thickness, as a function of the permittivity of the one or more materials forming the insulation system.

One exemplary embodiment of a cable that addresses the constraints of a minimum pressure of 1000 mbar and a given maximum temperature of 80° C., and a PDIV resistance threshold of 3.946 kV then has the below dimensions mean diameter of the conductor=2.15 mm (±10%);

mean thickness of the single layer of insulation of the insulation system when the permittivity is 2.10 is of the order of 1 mm.

Another subject of the invention is a multilayer insulation system such that the equivalent insulation thickness $t_{eq}$ is determined as a function of the respective radial thicknesses of each of the layers forming the insulation system and such that:

$$t_{eq} = \sum_{x=1}^{Nombre\ de\ couches\ de\ l'isolation} \frac{e_x}{\varepsilon_{rx}} \qquad \text{[Math. 4]}$$

where $e_x$ is the radial thickness of a layer x and $\varepsilon_{rx}$ is the permittivity of the layer x.

For a thickness of the electrically insulating layer ei of 0.50 mm and a permittivity of 2.10, good agreement between the measured results and the calculated results are obtained, as the results below show. The measured partial discharge inception voltages (PDIVs) are expressed as the mean of 10 measurements and the coefficient of variation (the ratio of the standard deviation to the mean). The measured PDIV is close to the calculated PDIV and is slightly higher. Thus, the invention ensures operation without partial discharges within the specified PDIV limit without an excessive margin with regard to determining the PDIV, which would result in an overly high thickness and therefore weight.

| Maximum temperature [° C.] | Minimum pressure [mbar] | Mean of the measurements [Vpeak] | Coefficient of variation | Calculated PDIV [Vpeak] | Difference between calculated PDIV and means of the measurements [%] |
|---|---|---|---|---|---|
| 40 | 200 | 1216 | 4% | 1213 | 0.3% |
| 40 | 400 | 1761 | 4% | 1655 | 6.4% |
| 40 | 600 | 2227 | 3% | 2218 | 0.4% |
| 40 | 800 | 2616 | 4% | 2536 | 3.2% |
| 40 | 1000 | 2871 | 5% | 2802 | 2.5% |

For a thickness of the electrically insulating layer ei of 1 mm and a permittivity of 2.10, the below results are obtained. Here again, good agreement between the measured results and the calculated results are demonstrated for various minimum pressures and various maximum temperatures.

| Maximum temperature [° C.] | Minimum pressure [mbar] | Mean of the measurements [Vpeak] | Coefficient of variation | Calculated PDIV [Vpeak] | Difference between calculated PDIV and means of the measurements [%] |
|---|---|---|---|---|---|
| 40 | 200 | 1716 | 6% | 1655 | 3.7% |
| 40 | 400 | 2665 | 2% | 2433 | 9.5% |
| 40 | 600 | 3336 | 3% | 3326 | 0.3% |
| 40 | 800 | 4048 | 3% | 3820 | 6.0% |
| 40 | 1000 | 4642 | 3% | 4225 | 9.9% |
| 80 | 200 | 1710 | 4% | 1601 | 6.8% |
| 80 | 400 | 2494 | 3% | 2231 | 11.8% |
| 80 | 600 | 3174 | 5% | 3046 | 4.2% |

-continued

| Maximum temperature [° C.] | Minimum pressure [mbar] | Mean of the measurements [Vpeak] | Coefficient of variation | Calculated PDIV [Vpeak] | Difference between calculated PDIV and means of the measurements [%] |
|---|---|---|---|---|---|
| 80 | 800 | 3725 | 4% | 3655 | 1.9% |
| 80 | 1000 | 4149 | 3% | 3946 | 5.2% |

In another example, for a PDIV threshold of 1000 Vrms, i.e. 1414 Vpeak in amplitude, for a maximum flight altitude of 35 k ft, corresponding to exposure to a minimum pressure of 238 mbar and a maximum temperature of 150° C., a teq=0.367 mm corresponds to an electrically insulating layer formed with 95% by weight of perfluoroalkoxy alkane (PFA) copolymer with a radial thickness of 0.79 mm.

The invention claimed is:

1. An aerospace cable that limits the occurrence of partial discharges comprising:

an elongate electrically conductive element; and an insulation system having a plurality of electrically insulating layers surrounding said elongate electrically conductive element, wherein each of the plurality of electrically insulating layers of the insulation system has a radial thickness, and wherein an equivalent insulation thickness (teq) of this insulation system is greater than the result of a polynomial function equation of a minimum pressure and of a maximum temperature at which the cable is intended to be used, and wherein the equivalent insulation thickness $t_{eq}$ and the respective radial thicknesses satisfy the following relationship:

$$t_{eq} = \sum_{x=1}^{\text{Numbers of layers of the insulation system}} \frac{e_x}{\varepsilon_{rx}} \quad \text{[Math. 4]}$$

where $e_x$ is the radial thickness of a layer x
and $\varepsilon_{rx}$ is the relative dielectric permittivity of the layer x, and wherein the equivalent insulation thickness $t_{eq}$, in mm, is such that:

$$t_{eq} \geq \sum_{n=1}^{4} a_n \cdot PDIV^{n-1} \quad \text{[Math. 1]}$$

with $$a_n = \sum_{m=1}^{4} b_{n,m} \cdot p_T^{n-1} \quad \text{[Math. 2]}$$

and $$p_T = \frac{273,15}{273,15 + T} \quad \text{[Math. 3]}$$

where $p_T$ is the minimum pressure in mbar or hPa

T is the maximum temperature in degrees Celsius and
PDIV represents an amplitude of the partial discharge inception voltage, in kV (kVpeak), under the minimum pressure and maximum temperature conditions, and wherein coefficients from the equations math 1, math 2, and math 3 are the following:

| $b_{n,m}$ | n = 1 | n = 2 | n = 3 | n = 4 |
|---|---|---|---|---|
| m = 1 | −0.58133 | 0.81629 | 0.02282 | 0.00864 |
| m = 2 | 2.11632 | −2.91153 | −0.02497 | −0.03217 |
| m = 3 | −2.88833 | 3.94018 | 0.01584 | 0.04238 |
| m = 4 | 1.31095 | −1.78528 | −0.01122 | −0.01814 |

2. The cable according to claim 1, wherein the partial discharge inception voltage (PDIV) under the minimum pressure and maximum temperature conditions is higher than or equal to a breakdown voltage in air between two planar electrodes, one of which is covered with an insulation system whose material and thickness are identical, respectively, to those of the insulation system of the cable.

3. The cable according to claim 1, wherein the maximum temperature is at most 260° C.

4. The cable according to claim 1, wherein the minimum pressure is at least 90 hPa and at most 1100 hPa.

5. The cable according to claim 1, wherein the insulation system fully or partly defines the outer periphery of the cable exposed to an exterior atmosphere which may correspond to the minimum pressure and/or to the maximum temperature.

6. The cable according to claim 1, wherein the insulation system is covered with a braid.

7. The cable according to claim 1, wherein the insulation system is covered with a braid, which is itself covered with a sheath.

8. The cable according to claim 1, wherein the cable further comprises a semiconductor layer between said insulation system and said elongate electrically conductive element, and wherein said semiconductor layer is the sole semiconductor layer in said cable.

9. The cable according to claim 8, wherein said semiconductor layer has a thickness $e_1$, the value of the thickness $e_i$ of the electrically insulating layer satisfying the following relationship:

$$e_i \geq e1 \quad \text{[Math. 5]}$$

and wherein said thickness $e_1$ ranges from 0.05 mm to 1.0 mm.

10. The cable according to claim 1, wherein at least one of said plurality of layers of the insulation system has colored pigments.

11. The cable according to claim 1, wherein said cable is an aircraft cable having a maximum flight altitude, such that the minimum pressure at which the cable is used is a function of said maximum flight altitude.

* * * * *